United States Patent
Meinhold et al.

(10) Patent No.: US 10,961,116 B2
(45) Date of Patent: Mar. 30, 2021

(54) MICRO-MECHANICAL SENSOR AND METHOD FOR MANUFACTURING A MICRO-ELECTRO-MECHANICAL SENSOR

(71) Applicant: Infineon Technologies Dresden GmbH & Co. KG, Dresden (DE)

(72) Inventors: Dirk Meinhold, Chemnitz (DE);
Steffen Bieselt, Stadt Wehlen (DE);
Erhard Landgraf, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/395,645

(22) Filed: Apr. 26, 2019

(65) Prior Publication Data
US 2019/0345027 A1    Nov. 14, 2019

(30) Foreign Application Priority Data
May 8, 2018    (DE) .......................... 102018111079.0

(51) Int. Cl.
*B81B 7/02*    (2006.01)
*B81B 7/00*    (2006.01)
*B81C 3/00*    (2006.01)

(52) U.S. Cl.
CPC ............... *B81B 7/02* (2013.01); *B81B 7/008* (2013.01); *B81B 7/0029* (2013.01); *B81C 3/001* (2013.01); *B81B 2201/0235* (2013.01); *B81B 2201/0242* (2013.01); *B81B 2201/0257* (2013.01); *B81B 2201/0264* (2013.01); *B81B 2201/03* (2013.01); *B81B 2203/0127* (2013.01); *B81B 2203/0315* (2013.01); *B81B 2203/04* (2013.01); *B81B 2207/07* (2013.01); *B81C 2203/038* (2013.01)

(58) Field of Classification Search
None
See application file for complete search history.

(56) References Cited

U.S. PATENT DOCUMENTS

| | | | |
|---|---|---|---|
| 9,643,838 B1 | 5/2017 | Chu et al. | |
| 2012/0025333 A1* | 2/2012 | Yoshida | G01P 15/0802 257/415 |
| 2015/0360936 A1 | 12/2015 | Tayebi et al. | |
| 2017/0210612 A1* | 7/2017 | Chen | B81B 3/001 |
| 2018/0099865 A1* | 4/2018 | Hsieh | B81B 3/0005 |
| 2020/0115221 A1* | 4/2020 | Chien | B81B 7/02 |

FOREIGN PATENT DOCUMENTS

| | | | |
|---|---|---|---|
| DE | 102012219465 A1 | 4/2014 | |
| EP | 2018673 B1 | 1/2014 | |
| EP | 2159540 B1 | 4/2017 | |

* cited by examiner

*Primary Examiner* — Long Pham
(74) *Attorney, Agent, or Firm* — Harrity & Harrity, LLP

(57) ABSTRACT

A micro-electro-mechanical sensor comprises a first substrate comprising an element movable with respect to the first substrate and a second substrate comprising a first contact pad and a second contact pad. The first substrate is bonded to the second substrate such that a movement of the element changes a coupling between the first contact pad and the second contact pad.

20 Claims, 11 Drawing Sheets

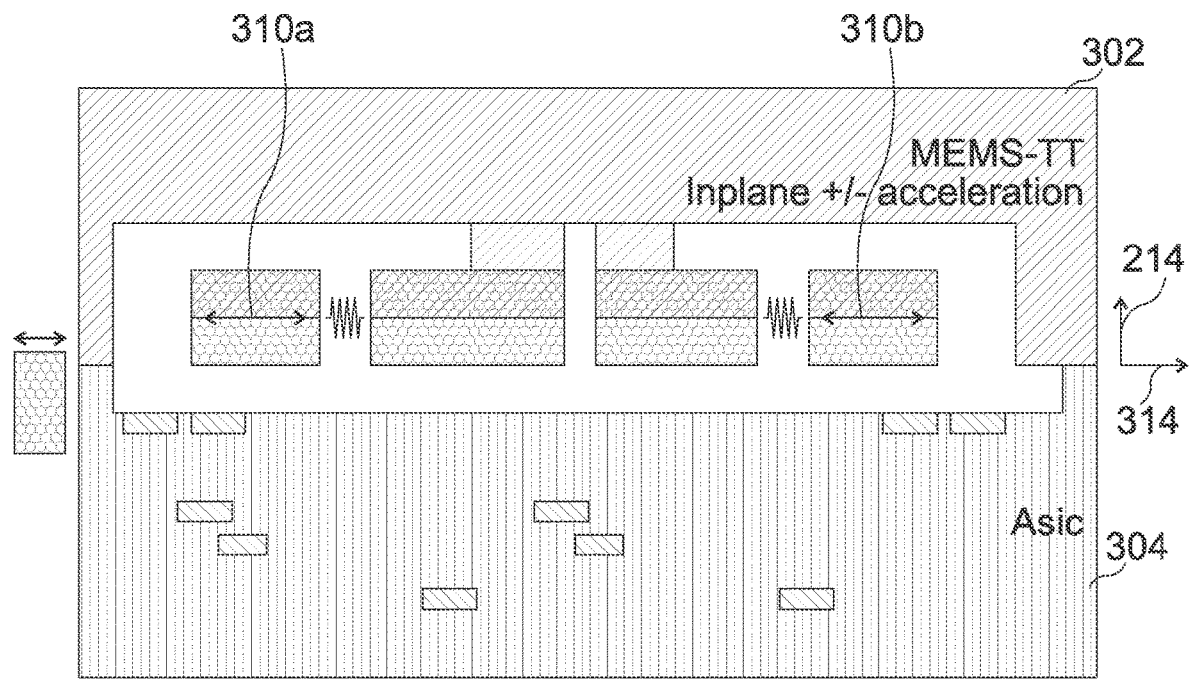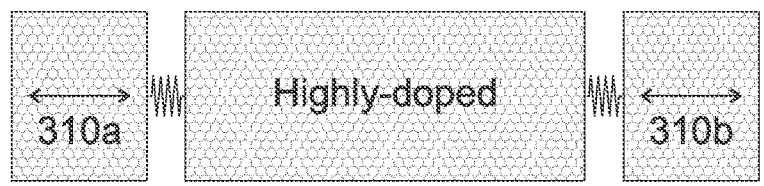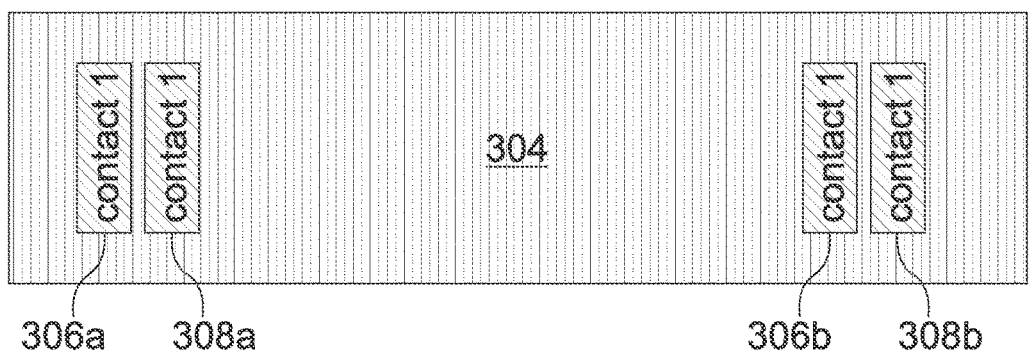
Fig. 4

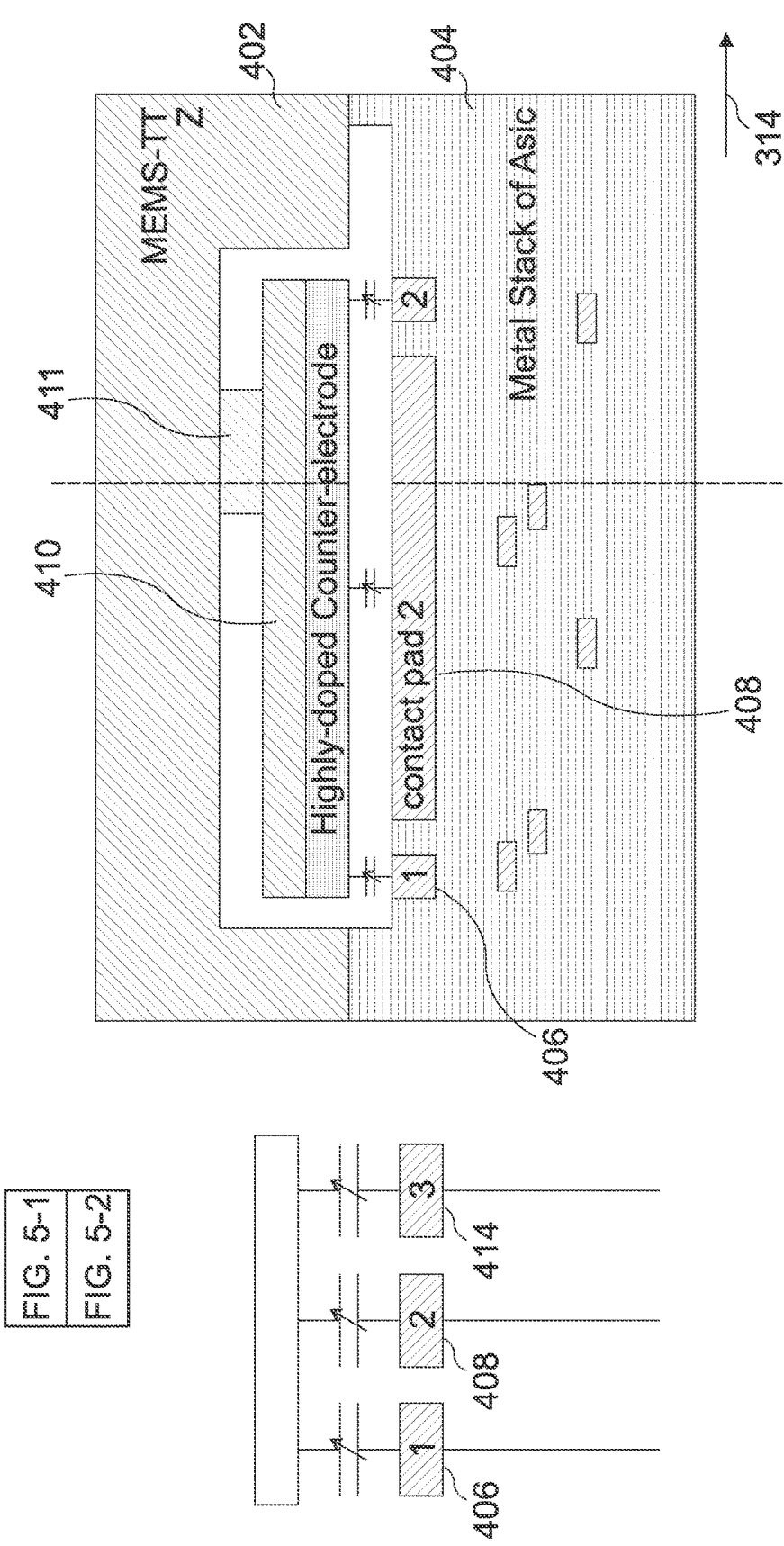

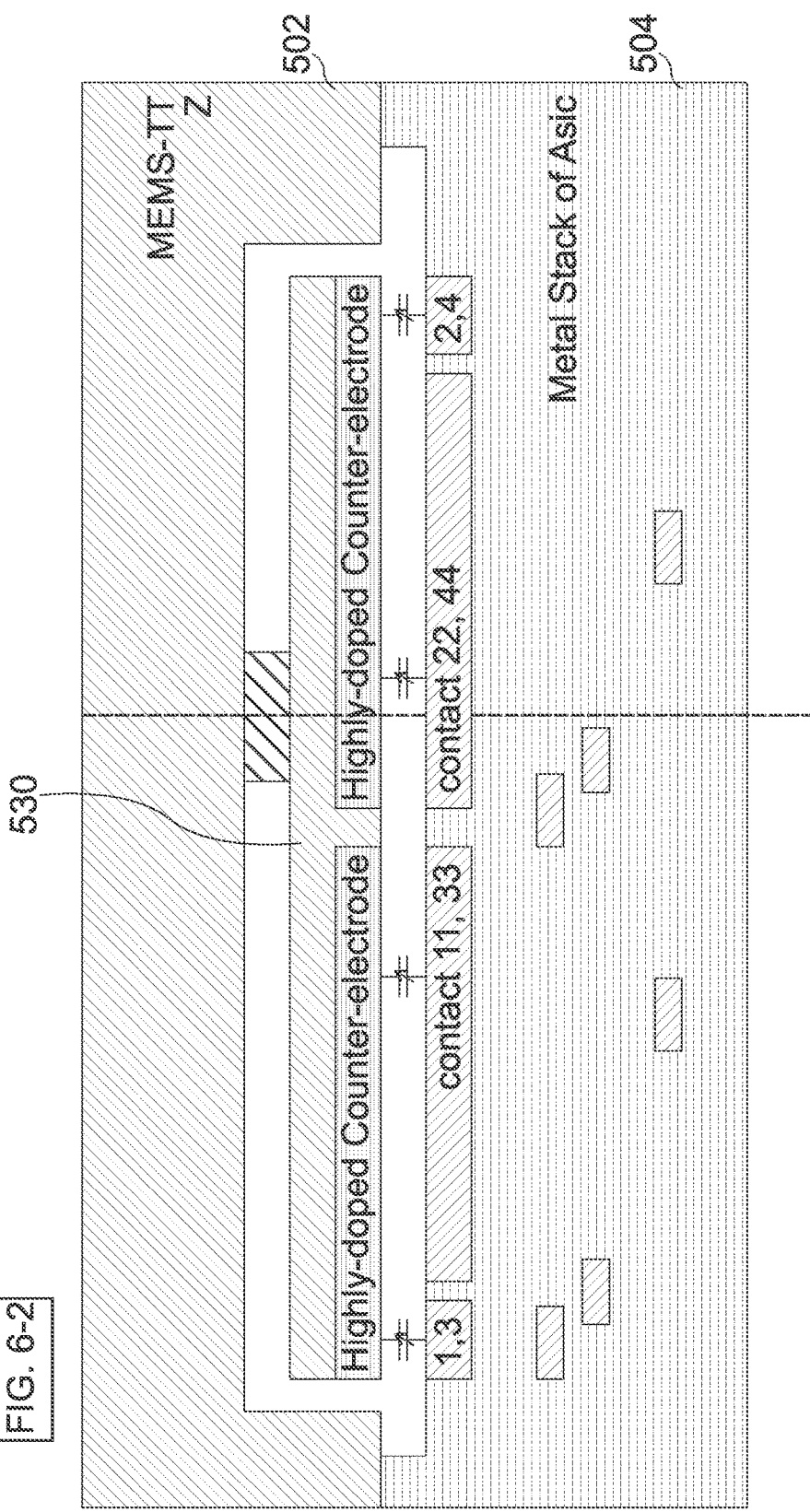

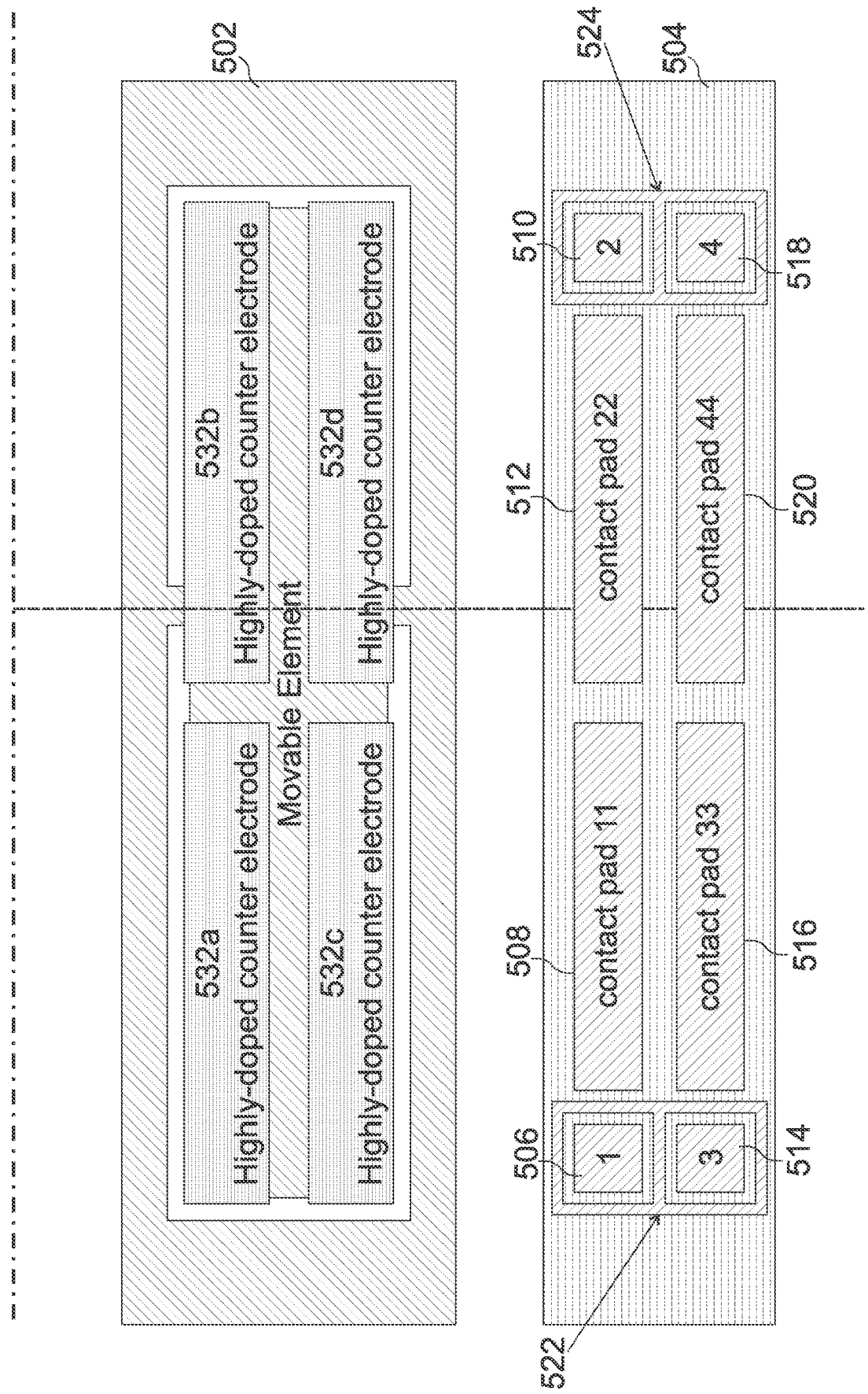

MICRO-MECHANICAL SENSOR AND METHOD FOR MANUFACTURING A MICRO-ELECTRO-MECHANICAL SENSOR

RELATED APPLICATION

This application claims priority under 35 U.S.C. § 119 to German Patent Application No. 102018111079.0, filed on May 8, 2018, the contents of which are incorporated by reference herein in their entirety.

TECHNICAL FIELD

Examples relate to Micro-electro-mechanical sensors and methods for manufacturing a micro-electro-mechanical sensor.

BACKGROUND

Micro-electro-mechanical sensors typically comprise a micro-electro-mechanical element which is structured using semiconductor processes. The micro-electro-mechanical element may, for example, be a membrane (pressure sensor filament) in the event of pressure sensors or microphones. Acceleration sensors may, for example, comprise movable inertia masses as a micro-electro-mechanical element. Usually, the micro-electro-mechanical element serves as an electrode which is movable relative to a counter electrode so that a coupling strength between the two electrodes can be measured to determine the relative movement between the two electrodes. Coupling may, for example, be capacitive or inductive. The physical quantity to be sensed by the micro-electro-mechanical sensor is typically derived from the coupling measured between the two electrodes. In order to measure the coupling, the electrode of the micro-electro-mechanical element and the counter electrode, which is typically fixed and not movable, need to be contacted. This may result in a considerable construction complexity in terms of design and technology.

SUMMARY

There may be a desire to decrease complexity for manufacturing micro-electro-mechanical sensors.

An implementation of a micro-electro-mechanical sensor comprises a first substrate comprising an element movable with respect to the first substrate and a second substrate comprising a first contact pad and a second contact pad. The first substrate is bonded to the second substrate such that a movement of the element changes a coupling between the first contact pad and the second contact pad. Creating the element movable with respect to the first substrate while having two fixed contact pads on the second substrate may allow to avoid contacting the movable micro-electro-mechanical element directly if the first substrate and the second substrate are bonded together with a relative orientation that results in a movement of the element changing the coupling between the two contact pads. Doing so may result in a significant decrease of design and manufacturing complexity for micro-electro-mechanical sensors. In particular, costly and sensitive bonding processes and contacting schemes between the two substrates may be avoided, such as for example the use of through selection vias (TSV) or of hybrid bonds. In particular, if the first and second substrates are created by different processes, savings may be significant, since the first substrate providing the movable element may be designed and manufactured independent from the second substrate comprising the contact pads and possible further readout circuitry. No electrical contact for the element may need to be established between the two substrates while manufacturing the micro-electro-mechanical sensor.

Some implementations of methods for manufacturing a micro-electro-mechanical sensor may provide a decrease in cost and complexity. Some implementations of methods comprise generating an element within a first substrate, the element being movable with respect to a body of the first substrate. The method further comprises providing a first contact pad and a second contact pad on a surface of a second substrate. According to some implementations, the first substrate is bonded to the second substrate such that the element faces the first and second contact pads opposite a cavity between the first substrate and the second substrate.

BRIEF DESCRIPTION OF THE FIGURES

Some examples of apparatuses and/or methods will be described in the following by way of example only, and with reference to the accompanying figures, in which

FIG. 4 is an example implementation of a micro-electro-mechanical sensor where an overlap between a movable element and a contact pad is variable;

FIG. 6 (which is shown as a combination of FIGS. 6-1 and 6-2) is a further example implementation of a micro-electro-mechanical sensor suitable for a full-bridge readout circuit;

DETAILED DESCRIPTION

Various examples will now be described more fully with reference to the accompanying drawings. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
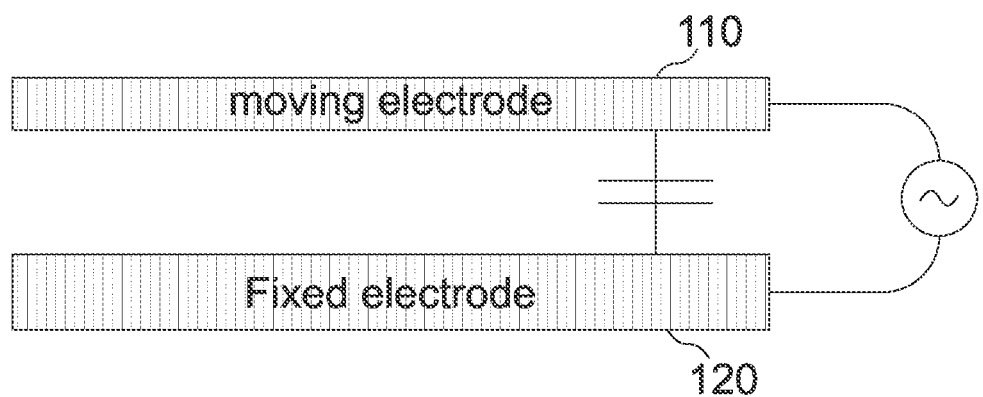
FIG. 1 is an example of an existing implementation.

FIG. 1 schematically illustrates an example of an existing implementation of an electrode 110 of a micro-electro-mechanical system (MEMS) which is movable with respect to a fixed counter electrode 120. In the example illustrated in FIG. 1, capacitive coupling between the movable electrode 110 and the fixed electrode 120 is evaluated to conclude on a relative movement between the movable electrode 110 and the fixed electrode 120. The relative movement may, for example, be evaluated to provide a microphone signal in a MEMS microphone or to derive an acceleration in an inertial sensor. To determine the coupling, both the movable electrode 110 and the fixed counter electrode 120 are contacted. In typical implementations, the movable electrode 110 is manufactured according to a micro-electro-mechanical-process. A micro-electro-mechanical-process (MEMS process) shall be understood to be any process also used to structure semiconductor substrates to generate a mechanically acting structure. The substrate of the fixed electrode 120 usually also comprises signal evaluation circuitry which further evaluates the results of the measurement of the capacitive coupling in order to derive information on a physical quantity determined by the MEMS-sensor. For example, an application specific integrated circuit (ASIC) or a Field Programmable Gate Array (FPGA) may be used as part of the evaluation circuitry to evaluate the variation of the capacitive coupling. In such a combination, the first substrate and the second substrate are generated using different processes (for example a MEMS process for the first substrate and Complementary metal-oxide-semiconductor, CMOS, for the second substrate), so that both substrates cannot be jointly created which requires costly and complex transfer of electrical contacts from the substrate comprising the movable electrode 110 to the substrate providing the fixed counter electrode 120. It may be beneficial to avoid such inter-substrate connects in micro-electro-mechanical sensors.

Figure 2:
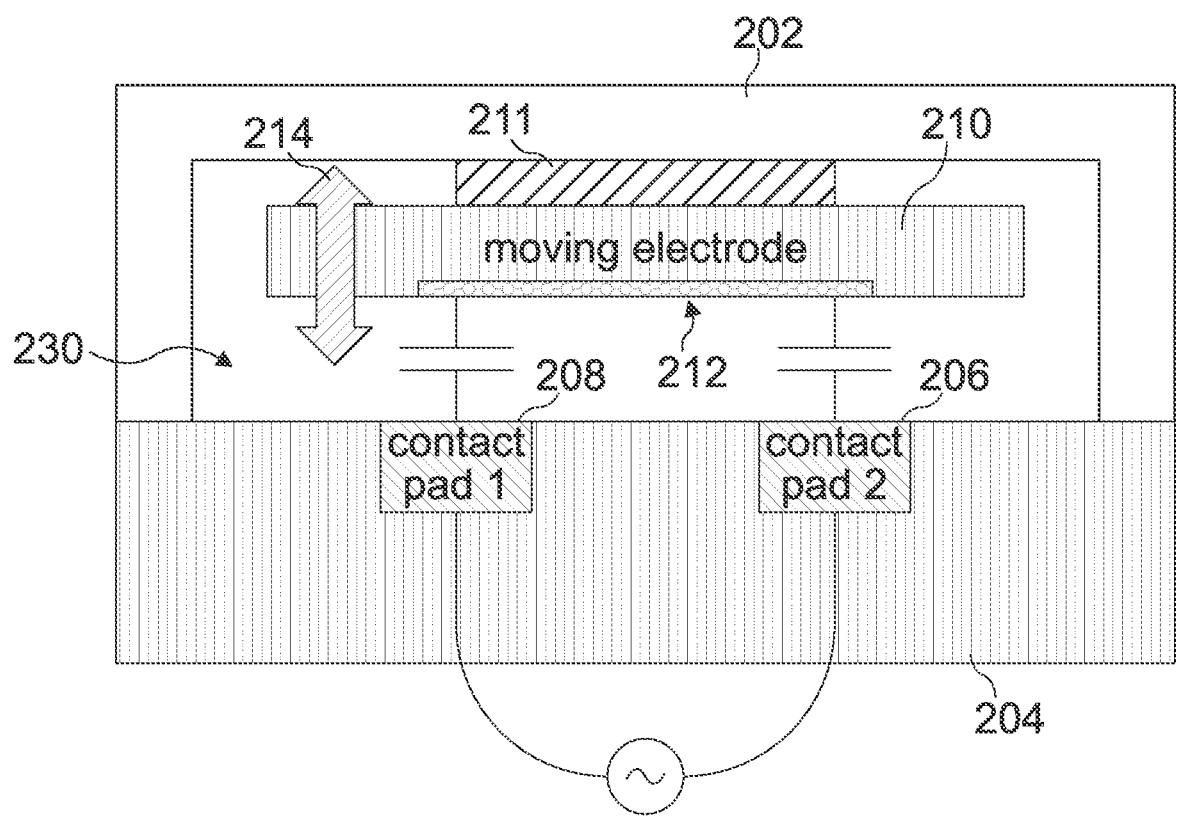
FIG. 2 is an example implementation of a micro-electro-mechanical sensor.
Figure 3:
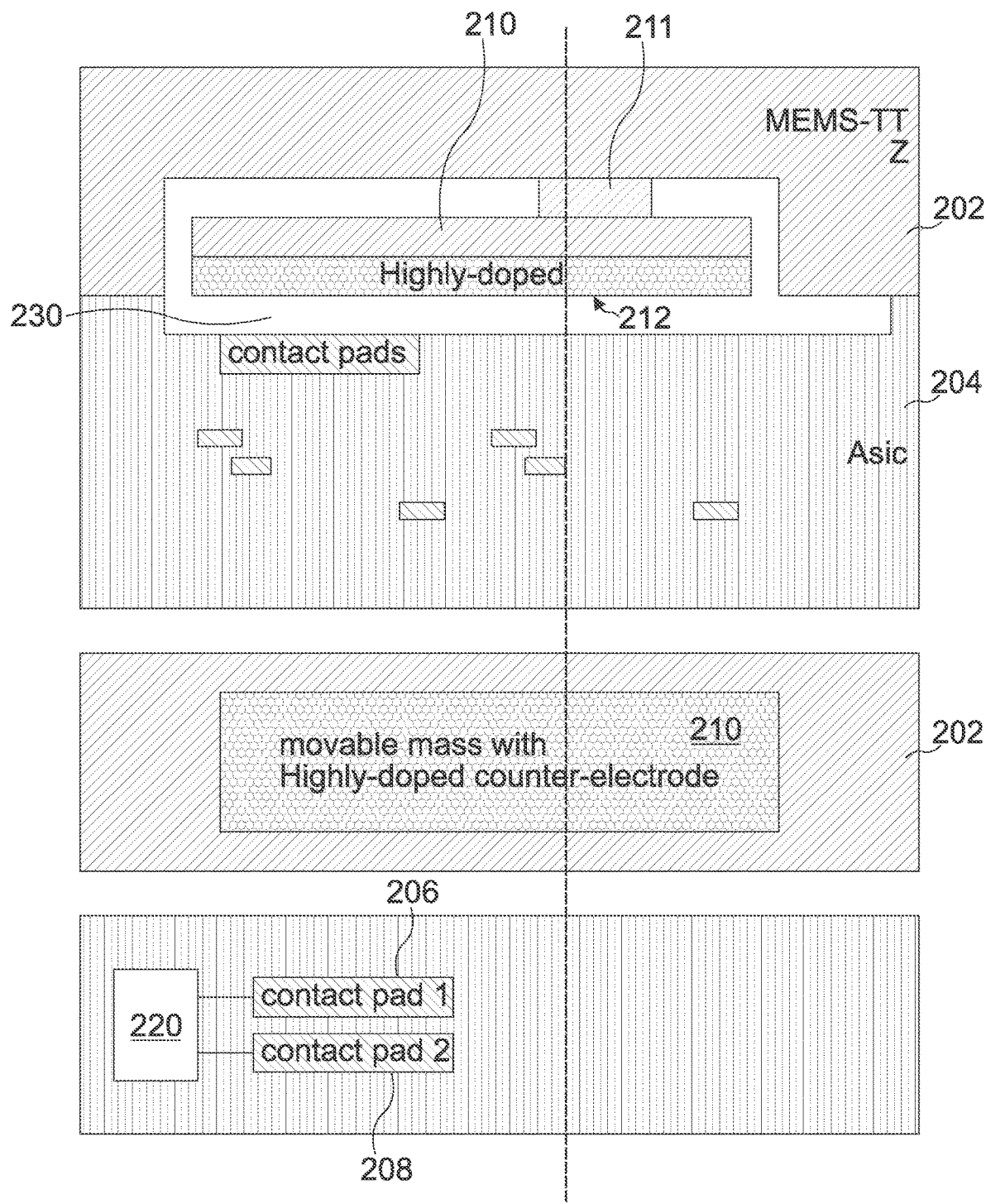
FIG. 3 is an example implementation of a micro-electro-mechanical sensor where a distance between a movable element and a contact pad is variable.

FIG. 2 illustrates a first cross-section of a part of an example implementation of a micro-electro-mechanical sensor, while FIG. 3 illustrates a further cross section of the micro-electro-mechanical sensor as well as a top view of both, the first substrate 202 and the second substrate 204. In the example implementation of FIG. 2, the first substrate 202 comprises an element 210 which is movable with respect to the first substrate 202. For example, the element 210 may be created within the first substrate 202 using micro-electro-mechanical-structuring.

To be movable with respect to the first substrate 202, the element 210 may, for example, be pivot-mounted with respect to the first substrate 202 using a bridge 211 of semiconductor material, dielectric material or a combination thereof. The bridge 211 can be created while excavating the element 210 from the first substrate 202 using known processes. The bridge 211 of FIG. 2 is understood to be only one particular example of how relative movement between at least parts of the element 210 and the first substrate 202 may be established while the first substrate 202 still provides support for the element 210. Further implementations may use arbitrary other mechanisms or structures to result with an element 210 being movable with respect to the first substrate 202. For example, the connections with the substrate constituting the hinge may also extend only in the plane of the element to connect the element with the substrate sideways. An element 210 that is movable with respect to the first substrate 202 shall be understood to be an element that comprises at least a portion that performs a relative movement with respect to the first substrate 202. In the example illustrated in FIGS. 2 and 3, the portions of the element 210 that are spaced apart from the bridge 211 perform a relative movement with respect to the first substrate 202 along a vertical direction 214.

A second substrate 204 comprises a first contact pad 206 and a second contact pad 208. The first substrate 202 and the second substrate 204 are bonded to one another in such a relative orientation that a movement of the element 210 changes a coupling between the first contact pad 206 and the second contact pad 208. If, for example, the distance between the element 210 and the contact pads 206, 208 is reduced, the first contact pad 206 couples stronger to the element 210 and also the second contact pad 208 may couple stronger to the element 210. By the dual mutual coupling, the first contact pad 206 couples to the second contact pad 208 via the element 210 since the element 210 faces both, the first contact pad 206 and the second contact pad 208 opposite a cavity 230 which is established between the contact pads and the element 210. Due to the functionality of the contact pads to measure coupling, the contact pads can also be referred to as electrodes herein. Due to the indirect coupling between the contact pads via the element 210, directly connecting the element 210 of the first substrate 202 to a contact pad of the second substrate 204 can be avoided while still allowing to determine a movement or displacement of the element 210.

To achieve good indirect coupling, some implementations comprise a conductive surface 212 at the element, the conductive surface facing the first contact pad 206 and the second contact pad 208 opposite the cavity 230. The contacted conductive surface 212 may increase charge carrier mobility to allow for a good response and to increase sensitivity to a relative displacement of the element 210 with respect to the contact pads 206 and 208. The conductive surface 212 may be achieved by arbitrary processes arriving at conductive surfaces, such as for example implanting dopants into a semiconductor substrate or by applying a metallization or the like. While the example implementation illustrated in FIGS. 2 and 3 illustrates a configuration where movement of the element 210 changes a distance between the element 210 and at least one of the first contact pad 206 and the second contact pad 208, arbitrary other configurations are feasible that result in a change of coupling between the two contact pads in the event of a movement of the element 210. An example in which a lateral movement of the element 210 changes coupling between two contact pads will subsequently be described with respect to the example implementation of FIG. 4.

The example implementation of FIGS. 2 and 3 allows to efficiently manufacture a micro-electro-mechanical sensor including signal evaluation circuitry 220 into the second substrate 204, as illustrated, for example, in FIG. 3. The signal evaluation circuitry 220 serves to measure a change of capacitive coupling between the first contact pad 206 and the second contact pad 208 and to further calculate a measurement value for a physical quantity based on the presently measured coupling. For example, in an inertial sensor, acceleration of the sensor element in the vertical direction 214 changes the capacitive coupling between the contact pads, allowing to calculate the applied force or acceleration. The signal evaluation circuitry may be implemented by any known structure configured to perform computations, such as for example using an ASIC or an FPGA. For example, a CMOS process may be used to create the signal evaluation circuitry 220 within the second substrate 204, so that the signal evaluation circuitry 220 is monolithically integrated within the second substrate 204.

Using an implementation of a micro-electro-mechanical sensor may, therefore, allow to separately manufacture the first substrate 202 comprising the electro-mechanical-structure and the second substrate 204 comprising evaluation circuitry or logic and to simply bond the substrates together using one or more wafer bonding processes to arrive at a functional micro-electro-mechanical sensor without requiring additional complex and costly bonding processes to electrically contact the element 210.

FIG. 4 illustrates a further example implementation of a micro-electro-mechanical sensor where an overlap between a movable element 310a and at least one contact pad is variable. In the example implementation of FIG. 4, the first substrate 302 comprises an element 310a which is movable with respect to the first substrate 302 in a lateral direction 314, which is perpendicular to the vertical direction 214. As illustrated in FIG. 4, the first electrode 306a and the second electrode 308a on the surface of the second substrate 304 are provided such that a lateral movement of the element 310a changes a lateral overlap of the element 310a with at least one of the contact pads 306a and 308a. The lateral overlap may be determined by projecting the area of the element 310a onto the contact pads 306a, 306b in the vertical direction. The change of the lateral overlap, in turn, changes the coupling between the first contact pad 306a and the second contact pad 308a. While the example implementation of FIG. 4 illustrates a lateral overlap being changed, further implementations may also be implemented to change a vertical overlap of an element with at least one of two contact pads.

The example implementation illustrated in FIG. 4 does furthermore comprise a second group of components comprising element 310b, first contact pad 306b and second contact pad 308b. Since the functionality is identical to the functionality of the group comprising element 310a, first contact pad 306a, and second contact pad 308a, a further detailed description of the second group of components is omitted. However, it should be noted that the geometry is chosen such that, upon application of a force causing both elements 310a and 310b to move in one direction, coupling between contact pads 306a and 308a changes opposite to the coupling between contact pads 306b and 308b. Such a configuration may be suitable to be directly used together with an amplifier in half-bridge configuration to sense the change of coupling of both groups of cooperating elements at a time. A particular example for such a configuration will subsequently be described with respect to FIGS. 6 and 7.

Figures 2, 5:
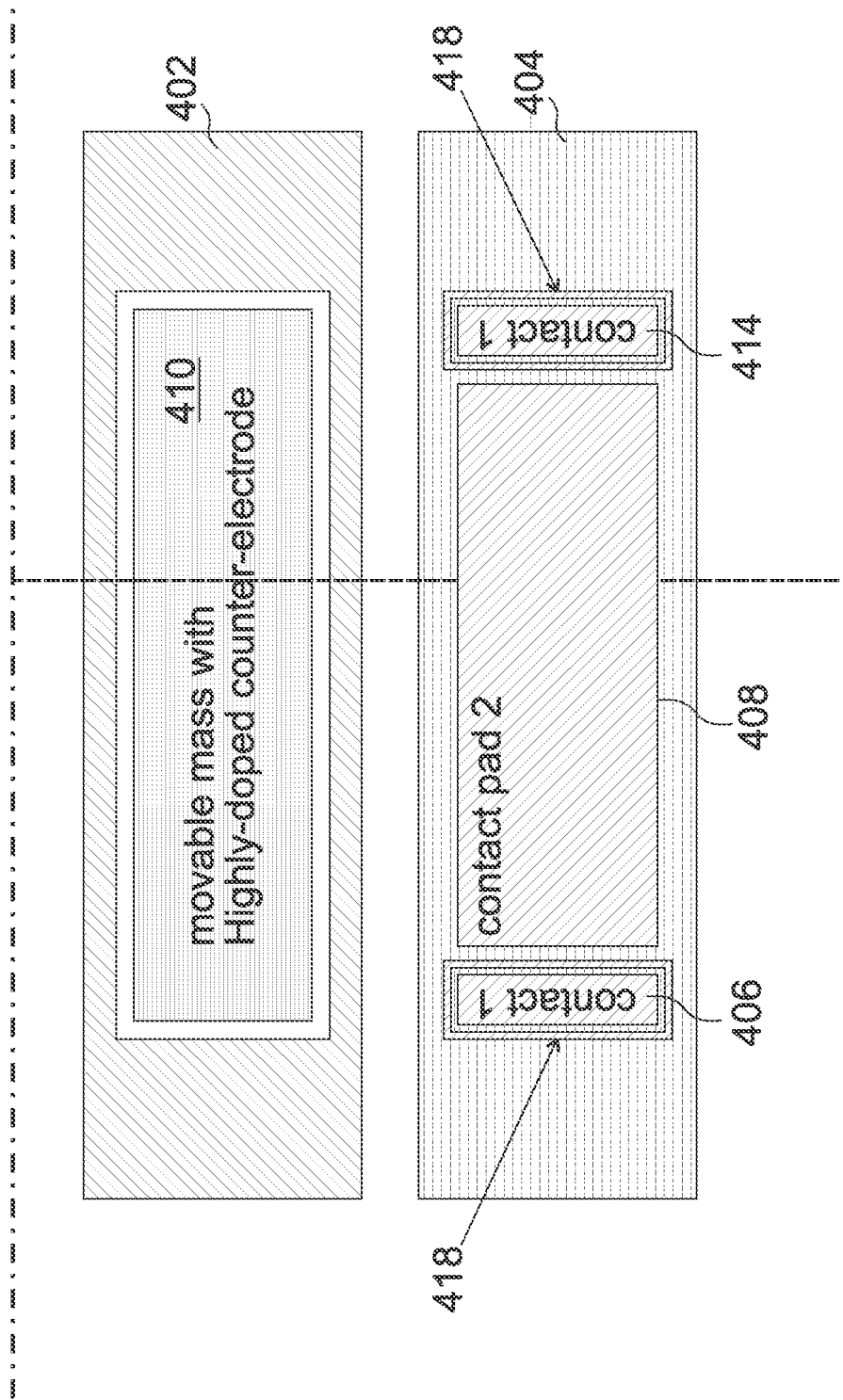
FIG. 5 (which is shown as a combination of FIGS. 5-1 and 5-2) is an example implementation of a micro-electro-mechanical sensor suitable for differential readout circuitry.

FIG. 5 illustrates a further example implementation of a micro-electro-mechanical sensor suitable for differential readout circuitry with an element 410 moving in vertical direction to change a distance between the element and contact pads. The micro-electro-mechanical structure of the example implementation of FIG. 5 (which is shown as a combination of FIGS. 5-1 and 5-2) corresponds to the micro-electro-mechanical structure of the example implementation of FIGS. 2 and 3. However, the contact pads are arranged differently on the surface of the second substrate 404 to intrinsically support differential readout. The example implementation illustrated in FIG. 5 comprises two pairs of corresponding contact pads, for which a mutual coupling can be determined separately. The first pair is constituted by first contact pad 406 and second contact pad 408. The second pair is constituted by the second contact pad 408 and the third contact pad 414. The second contact pad 408 is shared between the first contact pad 406 and the third contact pad 414. Therefore, it extends between the first contact pad 406 and the third contact pad 414 in the lateral direction. The relative movement of element 410 with respect to the first substrate 402 and the contact pads 406, 408 and 414 on the surface of the second substrate 404 is achieved like in the example implementation of FIGS. 2 and 3, which uses a hinge constituted by a bridge 411 of semiconductor material, dielectric material or a combination thereof.

Similar to the example implementation of FIG. 4, the capacitive coupling between first contact pad 406 and second contact pad 408, on the one hand, and third contact pad 414 and second contact pad 408, on the other hand, changes in opposite directions. As an alternative to the electrode configuration of FIG. 5, the second contact pad 408 may also be split into two separate contact pads, each contact pad being used to determine a coupling between one of the first contact pad 406 and the third contact pad 414. Such a configuration is subsequently illustrated in the example implementation of FIG. 6.

Further to the example implementations described with respect to FIGS. 2 to 4, the example implementation of FIG. 5 comprises a first electrically conductive shielding structure 416 surrounding the first contact pad 406. Further, a second electrically conductive shielding structure 418 surrounds the third contact pad 414. The shielding structures may be grounded. Using a shielding structure surrounding at least one of the two contact pads whose indirect mutual coupling is evaluated may decrease the direct coupling between the contact pads, which may increase reliability and sensitivity of the micro-electro-mechanical sensor. Electrically conductive shielding structures used may surround a contact pad with in a plane, e.g. on the surface of the second substrate 404, or in three dimensions, forming a well within the second substrate 404.

FIG. 6 (which is shown as a combination of FIGS. 6-1 and 6-2) illustrates a further example implementation of a micro-electro-mechanical sensor suitable for a full-bridge readout circuit.

The mechanical setup is equal to the example implementation illustrated in FIGS. 2-4 and 5. However, the example implementation of FIG. 6 comprises four pairs of contact pads whose indirect mutual coupling is evaluated. First pair is constituted by first contact pad 506 and the second contact pad 508 on a surface of second substrate 504 facing the first substrate 502. A second pair is constituted by the third contact pad 510 and the fourth contact pad 512, a third pair is constituted by fifth contact pad 514 and six contact pad 516, and a forth pair is constituted by seventh contact pad 518 and eight contact pad 512. First shielding structure 522 surrounds the first contact pad 502 and the fifth contact pad 514. Second shielding structure 524 surrounds the third contact pad 510 and the seventh contact pad 518. Unlike in the example implementation of FIG. 5, the element 530 comprises four separate electrically conductive surface portions 532a to 532d, each indirectly coupling a pair of corresponding contact pads. Upon movement of the element 530, the coupling of two pairs of corresponding contact pads changes in the opposite direction. In particular, coupling between the first contact pad 506 and the second contact pad 508 changes opposite to coupling between the third contact pad 510 and the fourth contact pad 512. Likewise, coupling between the fourth contact pad 514 and the fifth contact pad 516 changes opposite to the coupling between the seventh contact pad 518 and the eighth contact pad 520. Due to this property, the configuration illustrated in the example implementation of FIG. 6 is intrinsically suitable to be read out using a full bridge readout circuit, as for example illustrated in FIG. 7.

Figure 7:
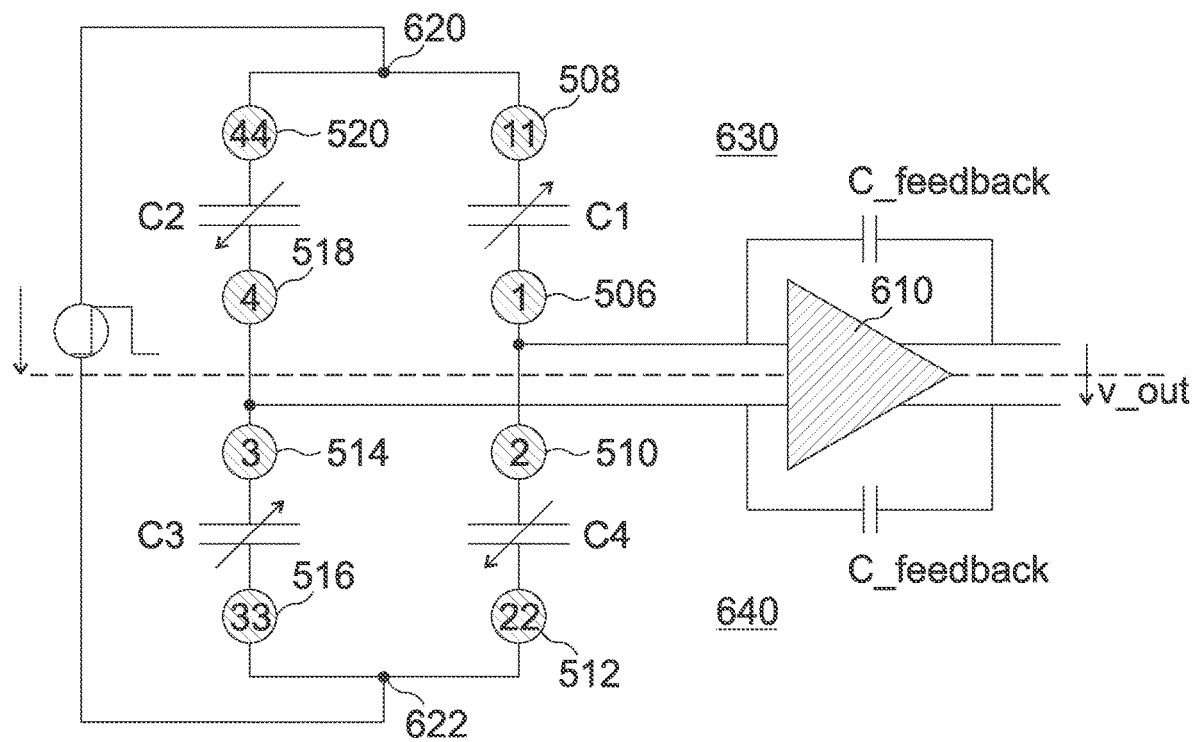
FIG. 7 is an example implementation of a full-bridge readout circuit for the example implementation of FIG. 6.

FIG. 7 illustrates an example implementation of a full-bridge readout circuit for the example implementation of FIG. 6. For the full-bridge readout circuit, a differential amplifier 610 is used. The full-bridge readout circuit basically is a combination of two half-bridge readouts. A single half-bridge readout uses only one of the differential inputs of amplifier 610. Since corresponding pairs of contact pads change the coupling in different directions upon movement of the element 530, those corresponding pairs are intrinsically suitable to be used for half-bridge readout circuits. A first half bridge 630 uses contact pads 506, 508, 510 and 512. The first contact pad 506 and the third contact pad 510 are coupled to an input terminal of the amplifier 610. The second contact pad 508 is coupled to a first supply voltage 620, and the fourth contact pad 512 is coupled to a second supply voltage 622 to complete the setup of half-bridge 630. A second half-bridge 640 completes the full-bridge setup and uses contact pads 510, 512, 514, and 516 in a like manner. Using a half-bridge readout or a full-bridge readout together with example implementations described herein may increase sensitivity of the circuit and increase robustness to external electrical fields or other disturbing influences.

While the previous example implementations illustrate two particular mechanical configurations, further example implementations may be based on alternative configurations. For example, the element may constitute an inert mass of mono silicon which is isolated by oxidized venetia channels. The element may constitute an inert mass of mono silicon suspended by separate means (hinge formed by a defined patch of semiconductor or dielectric material). The element may constitute an inert mass of mono silicon not isolated but in electrical contact to the first substrate. The element may be isolated from the first substrate by a p-n junction. The element may constitute an inert mass which is manufactured by an EPI-Poly process. The first and second contact pads (electrodes) may be structured as a comb structure for a setup supporting in-plane readout. The element may comprise a thin isolated poly/metal electrode constituting a conductive surface. Multiple contact pads may be generated at different distances to the element (e.g. in different BEOL levels) to allow for different readout options (e.g. for x/y and z sensor). The first substrate may be held at a predetermined potential (voltage).

Figure 8:
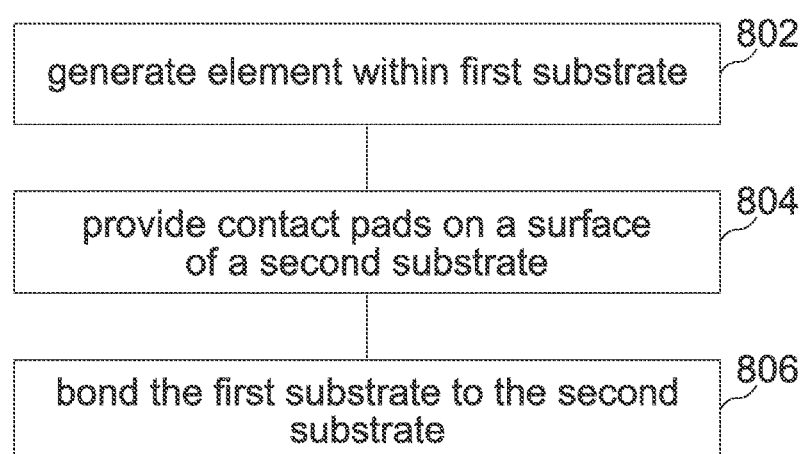
FIG. 8 is a block diagram of one example implementation of a method for manufacturing a micro-electro-mechanical sensor.

While the previous figures illustrated some implementations of micro-mechanical sensors, FIG. 8 illustrates a block diagram of a method for manufacturing a micro-electro-mechanical sensor. Manufacturing a micro-electro-mechanical sensor according to an implementation comprises generating an element 802 within a first substrate, the element being movable with respect to a body of the first substrate. The movable element within the first substrate may be generated using existing micro-electro-mechanical processes or semiconductor structuring processes. Generating the element within the first substrate may, for example, comprise a process flow comprising at least one of venetia processes, implants, deep trench etches, trench etch masks and (dry) stripping.

The method further comprises providing 804 a first contact pad and a second contact pad on a surface of a second substrate. According to some implementations, providing the first contact pad and the second contact pad may optionally comprise forming a recess in a surface of the second substrate and generating the first contact pad and the second contact pad within the recess. Forming a recess may allow to adjust the distance between the element and the contact pads based on structuring of the second substrate in addition to structuring the first substrate during the generation of the element. The contact pads may be generated using known processes resulting in contact pads, such as for example implanting or surface metallizing. Providing the first contact pad and a second contact pad may, for example, comprise a process flow comprising at least one of a BEOL to provide fixed electrode structures (eventually even in different BEOL layers), recess etching to form a cavity and a motion stopper, and defining a distance of the fixed ASIC contact pads (electrodes) to the MEMS element (counter-electrode) precisely by BEOL thin film deposition.

The method further comprises bonding 806 the first substrate to the second substrate such that the element faces the first and second contact pads opposite a cavity between the first substrate and the second substrate. Using existing wafer-bonding processes, a micro-electro-mechanical structure can so be generated that comprises contact pads whose mutual coupling is sensitive to a movement of the element without requiring to electrically contact the element directly and so to establish dedicated electrically conducting contacts between the first substrate and the second substrate. Bonding 806 the first substrate to the second substrate may, for example, comprise a process flow comprising at least one of Wafer Direct bonding, thinning of the first substrate (MEMS wafer), optional also of the second substrate (ASIC wafer). The process flow may optionally also comprise clean/Ti/Al/anneal to form a contact pad to control charge. The process flow may optionally also comprise BOSCH opening of the second substrate (MEMS Wafer) above the contact pads and Al (or Cu) blanket etching to open contact pads.

The method may optionally further comprise generating signal evaluation circuitry within the second substrate and coupling the first and second contact pads to a signal input of the signal evaluation circuitry, in order to monolithically include processing that derives a measurement value corresponding to physical quantity from the change of coupling between the contact pads. Including signal evaluation circuitry into the second substrate may result in an operational micro-electro-mechanical sensor already after bonding (and eventually singulation) the first substrate to the second substrate.

Figure 9:
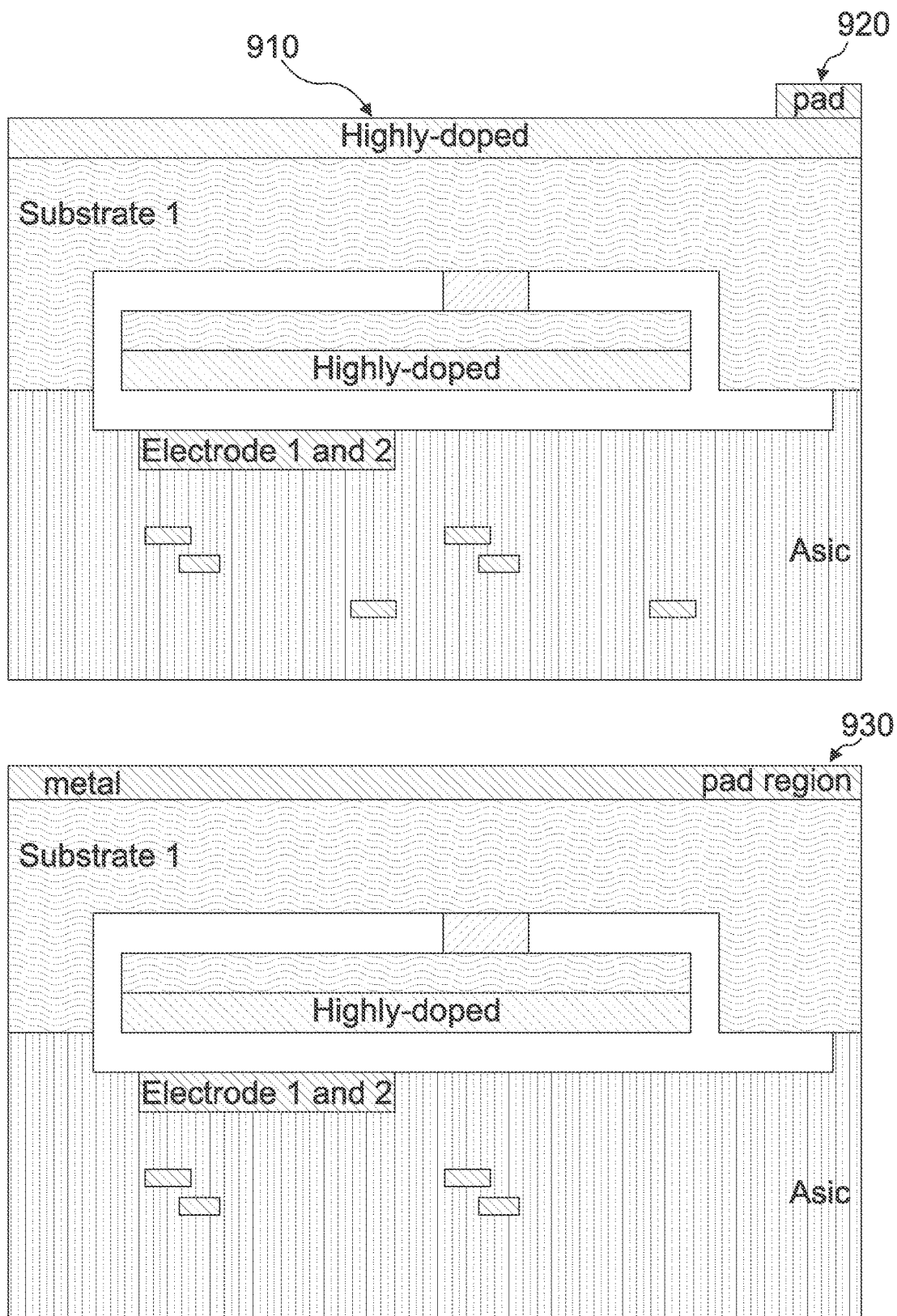
FIG. 9 shows two example implementations of a micro-electro-mechanical sensor allowing to control the potential of the first substrate.

FIG. 9 illustrates two further example implementations of a micro-electro-mechanical sensor that allows to control the potential of the first substrate. The example implementations of FIG. 9 are based on the layout of the example implementation of FIG. 4 and only the differences with respect to this example implementation are subsequently described in more detail.

In the example implementation illustrated in the upper graph of FIG. 9, the backside of the first substrate is highly doped. The surface 910 of the first substrate exhibits a higher dopant concentration than the body of the substrate which allow to electrically contact the body and to control its potential. As an alternative to using the full area of the backside (the side of the first substrate opposite the surface which faces the second substrate), only the surface in the region of the movable mass/element may be doped or multiple distinct regions of the surface may be highly doped to establish an electrical contact to the body. The highly doped surface may be contacted via a contact pad 920 of a metallization. In the event of multiple separated highly doped regions, multiple contact pads may be used.

The lower graph of FIG. 9 illustrates a further example implementation which allows to contact the body of the first substrate to control its potential using a metallization 930 at the backside of the first substrate. Using a metallization may additionally provide a shield against external electromagnetic fields. Alternatively, the contact to the first substrate may be established by arbitrary other means, such as for example by a TSV, a wire-bond, or a clip.

Having the capability to control the potential of the substrate may allow to control the parasitics and/or leakage between the moving mass and the first substrate. Further, ESD robustness may be increased and external EM fields may be blocked. According to some implementations, controlling the potential of the substrate may also serve as an additional means to actuate the movable element. Using a metallization may eventually also avoid the cost of a metal lid of a package the MEMS is to be housed in.

Figures 1, 10:
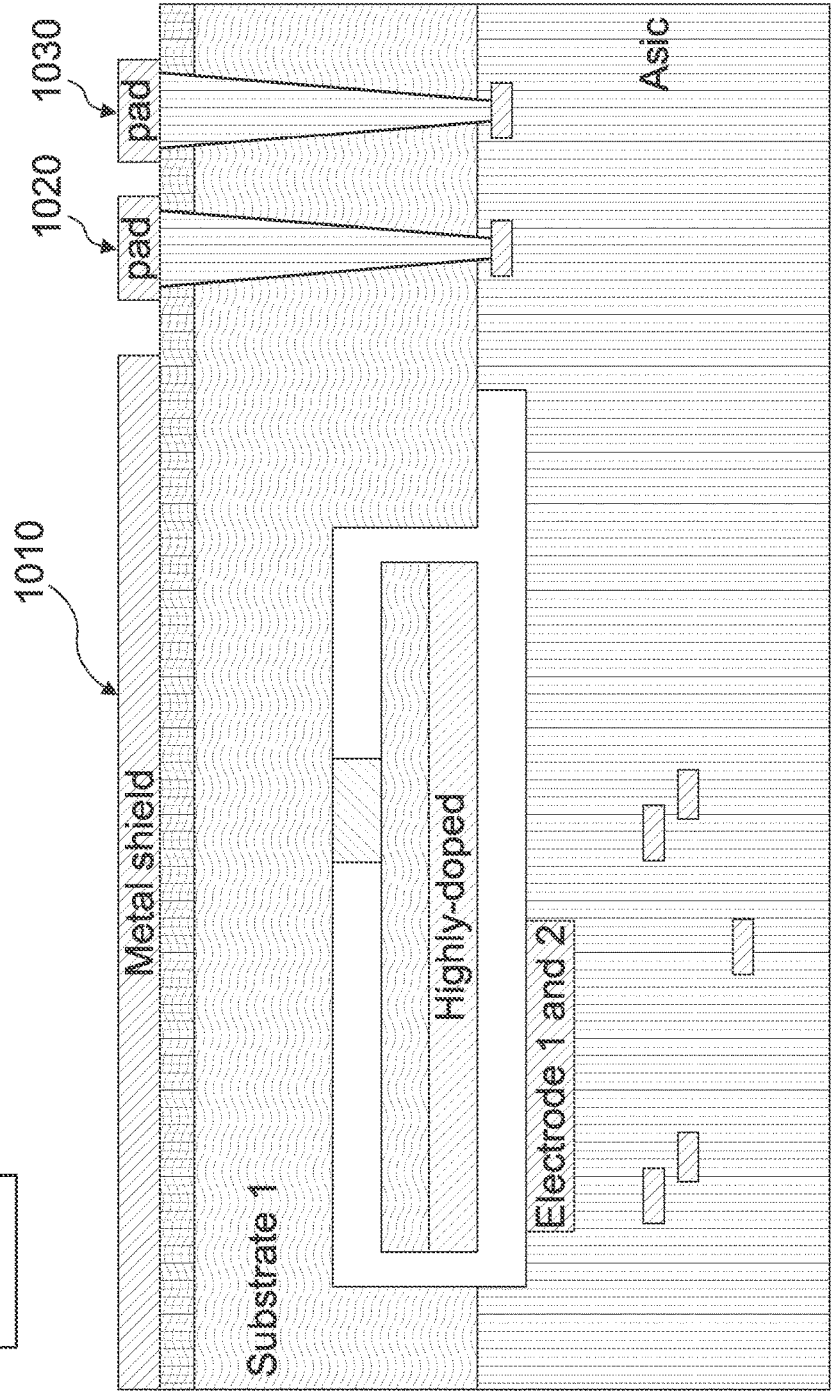
FIG. 10 (which is shown as a combination of FIGS. 10-1 and 10-2) shows two example implementations of a micro-electro-mechanical sensor allowing to contact evaluation circuitry within the second substrate from a backside of the first substrate.
Figures 2, 10:
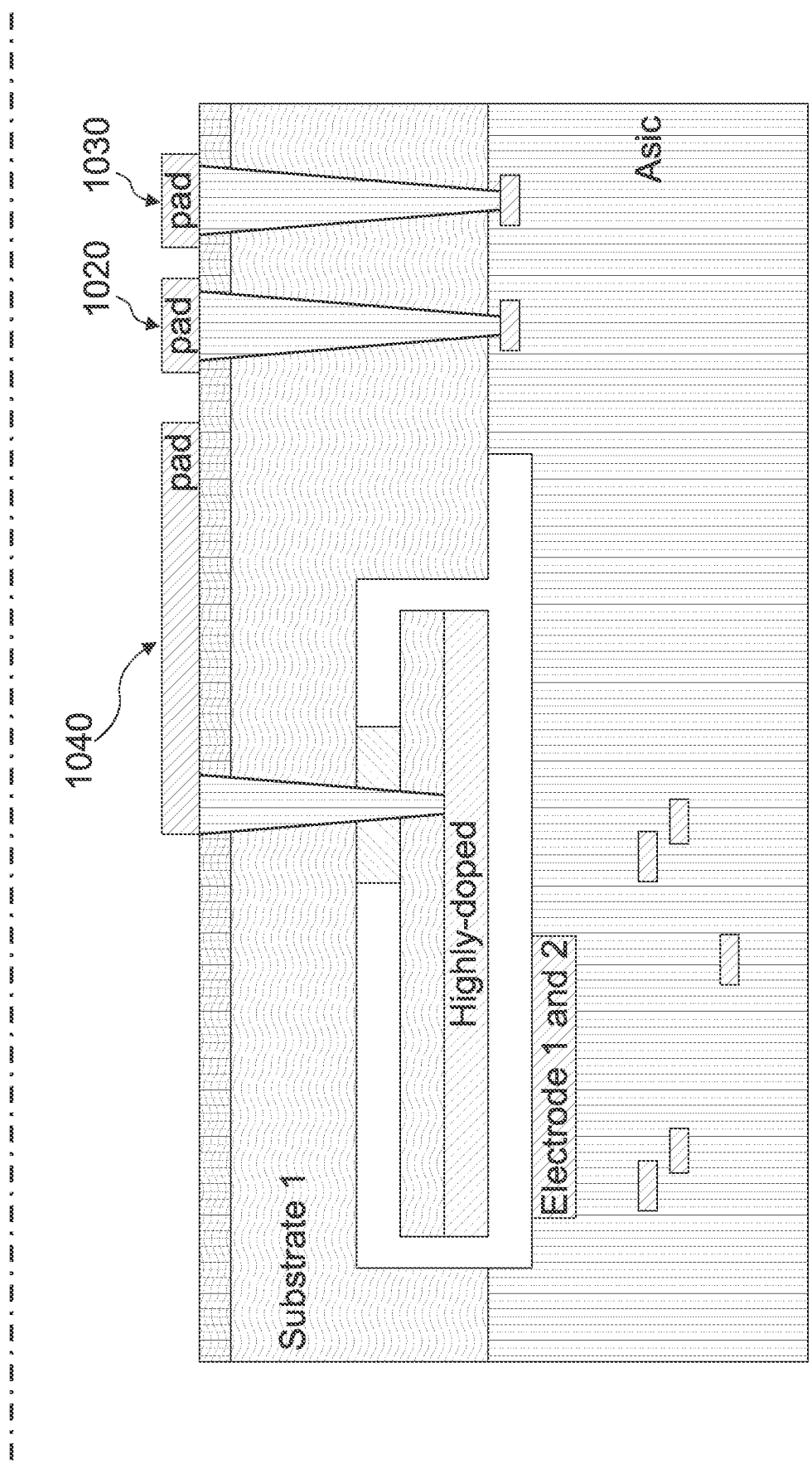

FIG. 10 (which is shown as a combination of FIGS. 10-1 and 10-2) illustrates two further example implementations of a micro-electro-mechanical sensor allowing to contact evaluation circuitry within the second substrate from a backside of the first substrate. Also, the example implementations of FIG. 10 are based on the layout of the example implementation of FIG. 4 and only the differences with respect to this implementation are subsequently described in more detail.

In the example implementation of the upper graph of FIG. 10, a first TSV 1020 and a second TSV 1030 are used to contact the second substrate directly or to contact pads within the second substrate from the backside of the first substrate, e.g. to establish readout contacts for electrical circuitry (e.g. an ASIC) integrated in the second substrate. In other words, an electrical contact via (1040) extends from a surface of the first substrate which is opposite to the second substrate up to a contact pad in the second substrate. Further, a metallization 1010 laterally covering the movable element serves as an electromagnetic shield to the movable element while being isolated from the substrate. The metallization is present on a surface of the first substrate which is opposite to the second substrate. The TSVs may, for example, be copper or tungsten TSVs which are isolated form the first substrate and from the second substrate.

In the example implementation illustrated by the lower graph of FIG. 10, the movable mass/element is also contacted via a third TSV 1040. In particular, a highly doped surface of the movable element which faces the second substrate is contacted by third TSV 1040 from the backside of the first substrate. In other words, an electrical contact via (1040) extends from the surface of the first substrate which is opposite to the second substrate up to the movable element, in particular to an electrically conducting surface of the element. The third TSV 1040 may, for example, be a TSV of tungsten, which is isolated from the first substrate to be able to control the potential of the movable element with respect to the first and second substrates.

Establishing electrical contacts from the backside of the first substrate may allow to save area for contact pads on the second substrate. This may be of interest if the second substrate is more expensive than the first substrate or if the process to generate contact pads in the second substrate is costly or unreliable, which may be the case if the second substrate constitutes an ASIC.

The previous implementations have been mainly discussed with respect to the generation of a moving element within a micro-electro-mechanical sensor, it should be noted that micro-electro-mechanical sensors comprising such elements may be used to determine multiple measurement values for arbitrary physical quantities. For example, some implementations described herein may be used to constitute pressure-sensors, microphones, acceleration sensors, gyroscopes, or micro-mechanical actuators, for example actuators to generate ultrasound. For acceleration sensors and gyroscopes, the element movable with respect to the substrate may also be called a proof mass emphasizing that a mass of the element together with the deflection within a spring/mass system is used to determine a physical quantity. Likewise, for pressure-sensors and microphones, the element movable with respect to the substrate may also be called a membrane emphasizing that a deflection of the element is used to determine the physical quantity. The list of applications is not to be understood as being exhaustive, the micro-electro-mechanical structures described herein may be used to generate sensors for arbitrary environmental parameters or physical quantities.

In summary, a first implementation of a micro-electro-mechanical sensor comprises a first substrate comprising an element movable with respect to the first substrate and a second substrate comprising a first contact pad and a second contact pad. The first substrate is bonded to the second substrate such that a movement of the element changes a coupling between the first contact pad and the second contact pad. An implementation may serve to decrease complexity for manufacturing micro-electro-mechanical sensors.

In a second implementation, the micro-electro-mechanical sensor further comprises signal evaluation circuitry coupled to the contact pad and to the second contact pad, the signal evaluation circuitry being configured to calculate a measurement value based on the coupling between the contact pad and the second contact pad.

In implementation 3, the signal evaluation circuitry of implementation 2 is monolithically integrated within the second substrate which may enable to provide a functional MEMS sensor after bonding the two substrates together and eventually after optional subsequent singulation.

In implementation 4, in the micro-electro-mechanical sensor of implementations 1 to 3, the element comprises a conductive surface facing the first contact pad and the second contact pad opposite a cavity between the first substrate and the second substrate. Using a conductive surface may enhance charge carrier mobility within the element and so increase the sensitivity of the sensor.

In implementation 5, in the micro-electro-mechanical sensor of implementations 1 to 4, a movement of the element changes at least one of a lateral overlap or a vertical overlap of the element with at least one of the first contact pad and the second contact pad. Change of lateral overlaps and vertical overlaps may allow to implement in plane movement, which may allow to be sensitive to multiple directions without extensively thickening the sensor.

In implementation 6, in the micro-electro-mechanical sensor of implementations 1 to 4, a movement of the element changes a distance between the element and at least one of the first contact pad and the second contact pad.

In implementation 7, in the micro-electro-mechanical sensor of any of implementations 1 to 6, the coupling is a capacitive coupling.

In implementation 8, the micro-electro-mechanical sensor of any of implementations 1 to 7 further comprises at least one of a first electrically conductive shielding structure surrounding the first contact pad and a second electrically conductive shielding structure surrounding the second contact pad. Using a shielding structure may decrease direct coupling between the contact pads, which may provide a higher sensitivity of the sensor.

In implementation 9, the micro-electro-mechanical sensor of any of implementations 1 to 8 further comprises a third contact pad and a fourth contact pad within the second substrate, wherein a movement of the element changes a coupling between the third contact pad and the fourth contact pad opposite to the change of coupling between the first contact pad and the second contact pad. Such a sensor may be intrinsically configured to support a sensitive and robust half-bridge readout circuit.

In implementation 10, the micro-electro-mechanical sensor of implementation 9 further comprises an amplifier in a half bridge configuration within evaluation circuitry in the second substrate, the first contact pad and the third contact pad being coupled to an input terminal of the amplifier, the second contact pad being coupled to a first supply voltage, and the fourth contact pad being coupled to a second supply voltage.

In implementation 11, the measurement value of implementation 3 corresponds to one of pressure, acceleration, and angular velocity.

Implementation 12 is a method for manufacturing a micro-electro-mechanical sensor, comprising generating an element within a first substrate, the element being movable with respect to a body of the first substrate. The method further comprises providing a first contact pad and a second contact pad on a surface of a second substrate and bonding the first substrate to the second substrate such that the element faces the first and second contact pads opposite a cavity between the first substrate and the second substrate. An example implementation of a method may serve to decrease complexity for manufacturing micro-electro-mechanical sensors.

In implementation 13, the method of implementation 12 further comprises forming a recess in a surface of the second substrate and generating the first contact pad and the second contact pad within the recess. Generating a recess may allow to accurately adjust a distance between the element and the contact pads.

In implementation 14, the method of implementations 12 or 13 further comprises generating signal evaluation circuitry within the second substrate; and coupling the first and second contact pads to a signal input of the signal evaluation circuitry. Having signal evaluation circuitry within the substrate may result in arriving at a functional MEMS sensor after bonding the two substrates together and eventually after optional subsequent singulation.

Implementation 15 is a micro-electro-mechanical pressure sensor, comprising a first substrate comprising a membrane movable with respect to the first substrate and a second substrate comprising a first contact pad and a second contact pad. The first substrate is bonded to the second substrate such that a movement of the membrane changes a coupling between the first contact pad and the second contact pad.

Implementation 16 is a micro-electro-mechanical microphone, comprising a first substrate comprising a membrane movable with respect to the first substrate and a second substrate comprising a first contact pad and a second contact pad. The first substrate is bonded to the second substrate such that a movement of the membrane changes a coupling between the first contact pad and the second contact pad.

Implementation 17 is a micro-electro-mechanical acceleration sensor, comprising a first substrate comprising a proof mass movable with respect to the first substrate and a second substrate comprising a first contact pad and a second contact pad. The first substrate is bonded to the second substrate such that a movement of the proof mass changes a coupling between the first contact pad and the second contact pad.

Implementation 18 is a micro-electro-mechanical gyroscope, comprising a first substrate comprising a proof mass movable with respect to the first substrate and a second substrate comprising a first contact pad and a second contact pad. The first substrate is bonded to the second substrate such that a movement of the proof mass changes a coupling between the first contact pad and the second contact pad.

Implementation 19 is a micro-electro-mechanical actuator, a first substrate comprising a membrane movable with respect to the first substrate and a second substrate comprising a first contact pad and a second contact pad. The first substrate is bonded to the second substrate such that a movement of the membrane changes a coupling between the first contact pad and the second contact pad.

In Implementation 20, the micro-electro-mechanical actuator of claim 19 is configured to generate sound signals.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A micro-electro-mechanical sensor, comprising:
   a first substrate comprising an element movable with respect to the first substrate; and
   a second substrate comprising a first contact pad, a second contact pad, and signal evaluation circuitry,
   wherein the first substrate is bonded to the second substrate such that a movement of the element changes a capacitive coupling between the first contact pad and the second contact pad,
   wherein the signal evaluation circuitry is coupled to the first contact pad and to the second contact pad, and
   wherein the signal evaluation circuitry is configured to:
   calculate a measurement value based on a change of the capacitive coupling between the first contact pad and the second contact pad.

2. The micro-electro-mechanical sensor of claim 1, wherein the signal evaluation circuitry is monolithically integrated within the second substrate.

3. The micro-electro-mechanical sensor of claim 1, wherein the element comprises a conductive surface facing the first contact pad and the second contact pad opposite a cavity between the first substrate and the second substrate.

4. The micro-electro-mechanical sensor of claim 1, wherein the movement of the element changes at least one of a lateral overlap or a vertical overlap of the element with respect to at least one of the first contact pad or the second contact pad.

5. The micro-electro-mechanical sensor of claim 1, wherein the movement of the element changes a distance between the element and at least one of the first contact pad or the second contact pad.

6. The micro-electro-mechanical sensor of claim 1, further comprising at least one of:
   a first electrically conductive shielding structure surrounding the first contact pad; or
   a second electrically conductive shielding structure surrounding the second contact pad.

7. The micro-electro-mechanical sensor of claim 1, further comprising:
   a third contact pad and a fourth contact pad within the second substrate,
   wherein the movement of the element changes a capacitive coupling between the third contact pad and the fourth contact pad opposite to the change of the capacitive coupling between the first contact pad and the second contact pad.

8. The micro-electro-mechanical sensor of claim 7, further comprising an amplifier in a half bridge configuration within the signal evaluation circuitry,
   the first contact pad and the third contact pad being coupled to an input terminal of the amplifier, the second contact pad being coupled to a first supply voltage, and the fourth contact pad being coupled to a second supply voltage.

9. The micro-electro-mechanical sensor of claim 1, wherein the measurement value corresponds to one of pressure, acceleration, or angular velocity.

10. The micro-electro-mechanical sensor of claim 1, further comprising:
    an electrical contact via extending from a surface of the first substrate which is opposite to the second substrate up to the element.

11. A method for manufacturing a micro-electro-mechanical sensor, comprising:
    generating an element within a first substrate,
    the element being movable with respect to a body of the first substrate;
    providing a first contact pad and a second contact pad on a surface of a second substrate;
    providing signal evaluation circuitry within the second substrate;

capacitive coupling the first contact pad and the second contact pad to a signal input of the signal evaluation circuitry,
wherein the signal evaluation circuitry is configured to:
calculate a measurement value based on a change of the capacitive coupling; and
bonding the first substrate to the second substrate such that the element faces the first contact pad and the second contact pad opposite a cavity between the first substrate and the second substrate.

12. The method of claim 11, further comprising:
forming a recess in a surface of the second substrate; and
generating the first contact pad and the second contact pad within the recess.

13. The micro-electro-mechanical sensor of claim 1, wherein the micro-electro-mechanical sensor is one of a pressure sensor or a microphone, and the element is a membrane.

14. The micro-electro-mechanical sensor of claim 1, wherein the micro-electro-mechanical sensor is an acceleration sensor, and the element is a proof mass.

15. The micro-electro-mechanical sensor of claim 1, wherein the micro-electro-mechanical sensor is a gyroscope, and the element is a proof mass.

16. The micro-electro-mechanical sensor of claim 1, wherein the micro-electro-mechanical sensor is an actuator, and the element is a membrane.

17. The micro-electro-mechanical sensor of claim 16, wherein the membrane is configured to generate sound signals.

18. The micro-electro-mechanical sensor of claim 1, wherein the first substrate comprises a doped conductive surface.

19. The micro-electro-mechanical sensor of claim 1, wherein the element comprises a doped conductive surface.

20. The micro-electro-mechanical sensor of claim 1, wherein the element comprises a metallization conductive surface.

* * * * *